United States Patent [19]

Naimpally

[11] Patent Number: 4,489,286
[45] Date of Patent: Dec. 18, 1984

[54] INDUCTIVE ELECTRICAL SIGNAL FILTER WITH REDUCED IMPEDANCE

[75] Inventor: Saiprasad V. Naimpally, Indianapolis, Ind.

[73] Assignee: RCA Corporation, New York, N.Y.

[21] Appl. No.: 479,984

[22] Filed: Mar. 29, 1983

[51] Int. Cl.³ ............................................. H03F 3/191
[52] U.S. Cl. .................................... 330/303; 307/520; 330/294
[58] Field of Search .......................... 307/520; 328/167; 330/144, 145, 294, 303

[56] References Cited

U.S. PATENT DOCUMENTS 2,908,752 10/1959 Lockhart ............................... 178/5.4
3,571,761 3/1971 Meek .................................. 330/303 X
4,207,590 6/1980 Naimpally .............................. 358/28

*Primary Examiner*—James B. Mullins
*Assistant Examiner*—Steven J. Mottola
*Attorney, Agent, or Firm*—Eugene M. Whitacre; Paul J. Rasmussen; Ronald H. Kurdyla

[57] ABSTRACT

A translating circuit couples an electrical signal filter to a signal path conveying signals to be filtered. The translating circuit exhibits unity current gain and a voltage gain other than unity between the signal path and the filter, and applies signals from the signal path to the filter. By setting the scale factor (e.g., attenuation) of the translating circuit, the impedance of the filter can be set to any desired level without affecting the operating parameters of the signal path. In the case of an inductive filter, the translating circuit permits the filter to be designed with a lower impedance, and a smaller value inductor less susceptible to picking up interference signals likely to adversely affect signals in the signal path, without requiring a corresponding adjustment in the operating parameters of the signal path.

18 Claims, 1 Drawing Figure

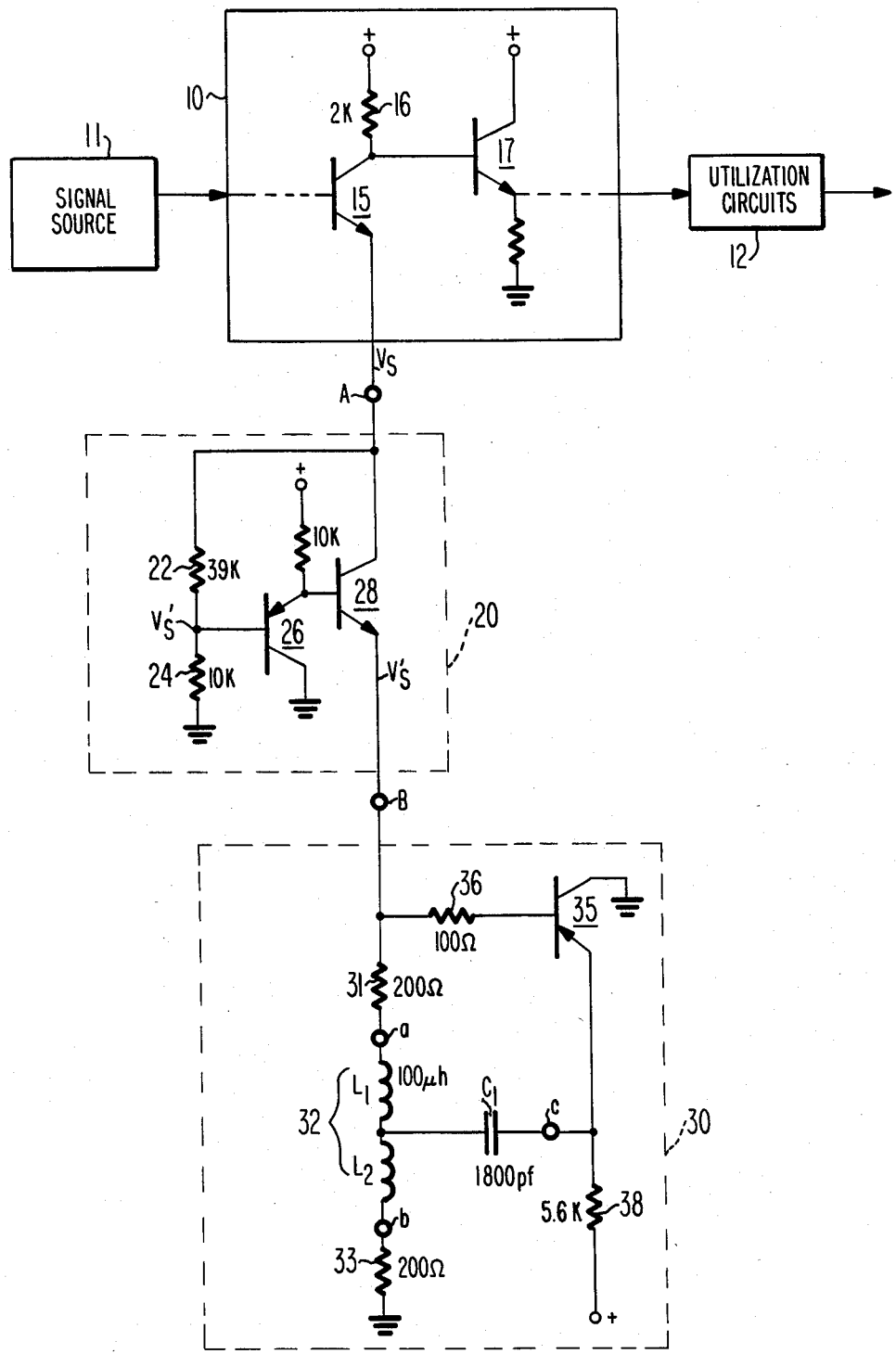

INDUCTIVE ELECTRICAL SIGNAL FILTER WITH REDUCED IMPEDANCE

This invention concerns a circuit arrangement employed in conjunction with an electrical signal filter. The circuit permits the filter impedance and the values of circuit elements associated with the filter to be tailored without requiring an associated change in the operating characteristics of the signal path to which the filter is coupled. In particular, the circuit arrangement permits the filter to use inductor values smaller than would otherwise be required in accordance with the intended filter transfer function.

Electrical signal filters using one or more inductors are often employed in signal processing systems. In particular, high order filters such as including "$\pi$" or "T" type configurations often use a plurality of inductors and capacitors. The values of the inductors and capacitors are a function of several factors, including the desired filter transfer function, the values of the filter terminating impedances, and the parameters of signal processing circuits with which the filter cooperates. Typically, the values of the inductors and capacitors are selected to achieve the desired filter transfer function after the values of the filter terminating impedances have been selected as dictated by the parameters of the associated signal processing circuits (e.g., impedance levels, signal gain and bias requirements).

Locally generated interference signals can be picked up by the filter inductors, causing degraded filter and signal processing performance. The likelihood of interference pick-up increases as inductor values increase. In a television receiver for example, interference signals can be associated with the magnetic fields generated by the deflection circuits of the receiver.

In accordance with the present invention, there is disclosed herein a circuit including an amplifier for coupling a filter to a circuit point in a signal processing path. The amplifier provides a version of signals conducted by the signal path to the filter. By setting the signal scaling factor of the amplifier, the impedance of the filter can be set to any desired level without affecting the operating parameters of the signal path.

More specifically, the disclosed circuit is intended to couple a second filter to the circuit point as a substitute for a first filter directly connected to the circuit point and having the same transfer function as the coupled second filter, but with an input impedance related to the input impedance of the second filter by a proportional factor N. In accordance with a feature of the invention, the amplifier exhibits substantially unity current gain and a voltage gain of 1/N between an input and output thereof. The amplifier input is coupled to the circuit point in the signal path, and the amplifier output is coupled to the second filter for providing thereto a version of signals conducted by the signal path.

The disclosed circuit permits the use of a (second) filter with, for example, a lower impedance and inductors with smaller values which are less susceptible of picking up interference signals, without compromising the intended transfer function of the filter and without requiring corresponding adjustment of the operating parameters of circuits in the signal path.

In accordance with a feature of the invention, the filter is of the high order, three terminal, two port type and is coupled to the signal path via a single interface terminal.

In the single drawing FIGURE, a signal processing network 10 responds to signals from a source 11 for providing translated output signals to utilization circuits 12. A signal path within network 10 includes an amplifier transistor 15 with an associated collector output load resistor 16, coupled to an emitter follower transistor 17.

A signal voltage $V_S$ appears at the low impedance emitter of transistor 15, and at a terminal A to which a signal translating circuit 20 is coupled. Translating circuit 20 includes a voltage divider comprising resistors 22 and 24, and a "zero voltage offset" buffer network including a PNP emitter follower transistor 26, and an NPN emitter follower coupling transistor 28 which provides an attenuated version of signal voltage $V_S$ at its low impedance emitter output and at a terminal B.

A synthesizing network 30 is coupled to terminal B, and includes a third order low pass filter 32 including inductors $L_1$ and $L_2$ and a capacitor $C_1$, and exhibits a low pass frequency response of zero MHz to 0.5 MHz. Resistors 31 and 33 serve as terminating impedances for filter 32. The configuration of filter 32 is that of a filter having three terminals (a,b,c), and two ports (a,b) between which the filter transfer function is developed. Filter 32 comprises a DC current path from the emitter of transistor 15 to ground, including terminal A, transistor 28, terminal B, resistors 31 and 33 and inductors $L_1$ and $L_2$ of filter 32. Network 30 also includes an emitter follower transistor 35, and a base resistor 36 suppressing the effects of parasitic capacitances associated with the base input of transistor 35. A bias resistor 38 determines the level of emitter bias current of transistor 35.

As will be discussed subsequently, network 30 synthesizes, at terminal B, an impedance having a transfer function related to the transfer function of high order filter 32. The operation of network 30 is also described in a copending U.S. patent application Ser. No. 470,618 of W. E. Sepp titled "High Order Electrical Signal Filters", assigned to the same assignee as the present invention and incorporated herein by reference.

In this embodiment amplifier transistor 15 is intended to exhibit a substantially unity DC gain, and an AC signal gain in accordance with the transfer function (i.e., the amplitude versus frequency response) of filter 32 for developing a signal voltage across resistor 16 in accordance with the filter transfer function. The unity DC gain requirement dictates that the DC impedance presented to the emitter of transistor 15 via terminal A exhibits the same value (2 kilohms) as the DC collector impedance represented by collector resistor 16.

Ordinarily, assuming network 20 was bypassed by a conductor connected between terminals A and B, this would require that filter terminating resistors 31 and 33 each exhibit values of 1 kilohm in the case of an equally terminated filter. To achieve the desired zero MHz to 0.5 MHz low pass transfer function for filter 32 would then require values of inductors $L_1$ and $L_2$ of approximately 560 $\mu$h and 120 $\mu$h respectively, or approximately five times greater than the illustrated values. Similarly, capacitor $C_1$ would require a value of approximately 390 pf, or approximately five times less than the illustrated value. Such larger values for inductors $L_1$ and $L_2$ render them much more susceptible of picking up interference signals (e.g., associated with stray magnetic fields), compared to the significantly lower values shown for inductors $L_1$ and $L_2$. The illustrated lower values for inductors $L_1$ and $L_2$ greatly reduce the likelihood of interference signal pick-up by these elements, and are permitted in accordance with the operation of translating circuit 20 without having to disturb the operating parameters of the signal path including amplifier transistor 15.

Translating circuit 20 exhibits unity current gain and a voltage gain other than unity between the signal path comprising transistor 15 and filter network 30, and applies signals from the signal path to filter 32 in network 30. The signal scaling factor (e.g., attenuation) of translating circuit 20 can be set at a desired level such that the impedance of filter 32 can be set at desired level without affecting the operating parameters of the signal path. The operation of networks 20 and 30 in conjunction with signal processor 10 will now be described.

The signal voltage at the emitter of amplifier transistor 15 and at terminal A is attenuated by a factor of five, in accordance with the values of voltage divider resistors 22 and 24, to produce an attenuated signal voltage $V_S'$ at the base of transistor 26 in network 20. Voltage $V_S'$ is also developed at the low impedance emitter of transistor 28 since transistors 26 and 28 are arranged in a "zero voltage offset" emitter follower configuration wherein the base-emitter voltage drops of each cancel one another, and each exhibit a substantially unity signal voltage gain of approximately 0.98. Attenuated signal voltage $V_S'$ is applied to synthesizing network 30 via terminal B.

Five-fold attenuated signal voltage $V_S'$ permits the impedance of filter 32 to be scaled down by approximately a factor of five, which permits the values of terminating resistors 31, 33 and inductors $L_1$, $L_2$ to be likewise scaled down in value by approximately a factor of five to the values illustrated. The illustrated values for inductors $L_1$ and $L_2$ are not scaled down by a factor of five exactly, since these inductor values are selected from standard values which are readily available commercially. As noted previously, the significantly reduced values of inductors $L_1$ and $L_2$ advantageously reduces the sensitivity of these inductors to interference pick-up.

The DC collector-emitter current of amplifier transistor 15 and the DC gain of transistor 15 remain substantially unchanged when using reduced impedance filter 32 in conjunction with translating network 20. The DC collector-emitter current of transistor 14 corresponds to the current conducted by terminal A, the collector-emitter current of transistor 28, and terminal B. The current conducted by terminal B is a function of the five-fold reduced voltage drive applied to terminal B from the emitter of transistor 28, divided by the substantially corresponding five-fold reduced impedance presented to terminal B by network 30 including filter 32.

Translating circuit 20 exhibits substantially unity current gain between terminals A and B, via the collector-emitter path of coupling transistor 28. Since network 30 with its associated impedance is coupled to the low impedance emitter of transistor 28, the magnitude of the signal voltage developed at the emitter of transistor 28 is essentially unaffected by the impedance of the filter network. Moreover, since the voltage at terminal B is one-fifth that at terminal A due to the attenuation provided by translating circuit 20 but the current at terminal A is the same as that at terminal B due to the unity current gain provided by circuit 20, the current conducted by transistor 15 is unchanged even though the impedance at terminal B presented by network 30 has been decreased by one-fifth.

The five-fold reduction in the values of inductors $L_1$ and $L_2$ requires a corresponding increase in the value of capacitor $C_1$ to maintain the desired filter transfer function. The increased value of capacitor $C_1$ is advantageous in that the effects of parasitic capacitances across the inductors and between the inductors to ground, for example, are less significant since the values of such parasitic capacitances are now less significant relative to the larger value of capacitor $C_1$. When network 20 is constructed in an integrated circuit device (e.g., together with signal processor 10), terminal B would correspond to an external connecting terminal of the integrated circuit device. In such case the lower impedance presented by network 30 to such terminal serves to reduce the effects of the parasitic capacitance associated with such external terminal.

The arrangement of network 30 including filter 32 is particularly advantageous since it represents a means by which a high order, two-port, three terminal filter can be connected to associated circuits by means of only a single interfacing terminal, e.g., terminal B. This result is desirable when there is only a single terminal (e.g., terminal A) of an integrated circuit (such as comprising circuit 10) available to provide a transfer function of a filter normally requiring both input and output terminals coupled in the signal path. The operation of synthesizing network 30 will now be described in detail.

Network 30 includes a substantially unity voltage gain PNP emitter follower transistor 35 with a high impedance base signal input electrode coupled to terminal B via resistor 36, and a low impedance emitter output electrode coupled to terminal c of filter 32. The arrangement of filter 32 with transistor 35 causes the collector current of amplifier transistor 15 to exhibit a transfer function H(s) corresponding to the transfer function H(s) of filter 32. Accordingly, an output signal voltage developed across collector load resistor 16 exhibits the transfer function of filter 32.

The attenuated signal voltage developed at the low impedance emitter of transistor 28 appears at terminal B and at the base input of voltage follower transistor 35. Transistor 35 exhibits a substantially unity signal voltage gain (e.g., approximately 0.98), and applies the signal voltage via the low impedance emitter of transistor 35 to intermediate terminal c of filter 32. In essence, transistor 35 acts as a second source of signal voltage for application to filter 32 via filter terminal c, the first source of signal voltage corresponding to the emitter of amplifier transistor 28 which is coupled to filter terminal "a" via terminal B and resistor 31.

It is noted that with this arrangement, signal voltages of similar phase and substantially equal magnitude are respectively applied to intermediate filter terminal c, and to resistor 31 which is connected to filter terminal "a" (i.e., a substantially zero signal voltage differential exists between filter terminal c and the point at which resistor 31 is connected to terminal B). Also, resistor 33 connects filter terminal "b" to a point of fixed potential (ground). Thus filter terminals a and c are excited with input signal voltages whereas filter terminal "b" is not. As a result, the current conducted by resistor 33 varies in accordance with the input signal voltage applied to terminal B, but does not exhibit the transfer function of filter 32. However, the current conducted by resistor 31 and terminal b exhibits the transfer function of filter 32. This current corresponds to the collector-emitter current of coupling transistor 28 and amplifier transistor 15, and causes load resistor 16 to exhibit a signal voltage having the transfer function of filter 32.

To better understand the operation of network 30, assume for the moment that three terminal filter 32 is connected in a conventional configuration. In such case intermediate terminal c would be connected to point of fixed reference potential (e.g., ground), and terminal a would be connected to ground via resistor 31. Input signals would be applied to terminal b via "input" resistor 33, and filtered signals would appear at terminal a across "output" resistor 31. In such a conventional filter configuration, terminal b alone would be modulated with input signals, while terminal c and the end of "output" resistor 31 which is remote from terminal a would both be at a fixed potential relative to input terminal b. The current conducted by "output" resistor 31 would exhibit the transfer function of the three terminal filter. This same result is achieved by the arrangement of network 30, wherein both filter terminals a and c are similarly excited with signals, but filter terminal b is coupled to fixed ground reference potential. Thus the disclosed arrangement of network 30, wherein two of the filter terminals are excited with signals relative to the third terminal which is coupled to a fixed potential, produces a result equivalent to that produced by a conventional three terminal filter configuration wherein only one of the filter terminals is excited with signal relative to the other two terminals which are coupled to fixed potentials.

Network 30 synthesizes, at terminal B, an impedance which is related to (i.e., the reciprocal of) the transfer function of three-terminal filter 32. The signal current conducted by resistor 31, terminal B and the collector-emitter path of transistor 28 corresponds to the product of the signal voltage at the emitter of transistor 28 and the transfer function of filter 32. In this regard it is noted that the emitter signal voltage of transistor 28 substantially corresponds to the base signal voltage of transistor 28, but the emitter signal current of transistor 28 exhibits the filter transfer function, as does the current conducted by amplifier transistor 15.

The format of filter 32 with transfer function H(s) is the same as the format of a filter that would otherwise be inserted in the signal path (i.e., via two connections to the signal path) to achieve transfer function H(s). Thus once the signal filtering transfer function is decided upon, a filter of conventional design can be utilized as described to implement such transfer function with respect to the signals to be filtered.

Emitter follower transistor 35 preferably exhibits a high input impedance presented to terminal "a" of filter 32 and a low output impedance presented to terminal c of filter 32 so as not to disturb the normally expected transfer function of filter 32. Transistor 35 preferably exhibits substantially unity voltage gain, although other voltage gains can be used. However, the transfer function imparted to the signal current conducted by resistor 31, terminal B and transistors 28 and 15 is identical to the filter transfer function when identical signal voltages are applied to resistor 31 and filter terminal c. Differences in the relative magnitudes of these signal voltages result in the current conducted by resistor 31 and terminal B exhibiting a transfer function which differs from the normally expected transfer function of the filter.

With some other types of filters it may not be necessary to employ two filter terminating resistors. For example, a resistor corresponding to resistor 31 may be deleted in certain cases. Signal voltages of equal magnitude would be applied directly to terminals a and c of such filters.

The arrangement of networks 20 and 30 can be used, for example, in conjunction with providing the filtering typically associated with the "I" and "Q" chrominance signal demodulators in a color television receiver, for example. In such case signal source 11 would correspond to a source of chrominance signals to be demodulated, processor 10 would include a "Q" (or "I") signal demodulator for supplying demodulated chrominance signals to amplifier transistor 15, and utilization circuits 12 would include a matrixing network for combining demodulated chrominance components with the luminance component of a color television signal to produce image representative color signals. The values of filter 32 would be tailored to achieve desired filtering of the demodulated signals. A typical chrominance signal processing system including "I" and "Q" demodulators, and filter synthesizing networks of the general type indicated by network 30, is described in the aforementioned copending U.S. patent application of W. E. Sepp. Reducing circuit sensitivity to interference pick-up in this environment is especially important since interference signals can introduce unwanted color shading of reproduced color pictures.

Although the principles of the present invention have been disclosed in the context of a particular embodiment, other embodiments of the invention are clearly possible. For example, the amount of signal voltage attenuation provided by network 20 can be tailored to suit the requirements of a particular system simply by changing the values of resistors 22 and 24. Other configurations of filter 32 also can be used (e.g., seventh order "π" type filters). In general, the principles of the present invention are useful with respect to any filter which provides a DC path to ground for signal processing circuits with which the filter is associated, and particularly when only one point in the signal path is available for coupling to the filter network.

What is claimed is:

1. A circuit for coupling a second filter to a circuit point in a signal processing path as a substitute for a first filter directly connected to said circuit point and having the same transfer function as said second filter but with an input impedance related to the input impedance of said second filter by a proportional factor N, where N is other than one, comprising:
   an amplifier with substantially unity current gain and a voltage gain of 1/N between an input and an output thereof, said input being coupled to said circuit point in said signal path, and said output being coupled to said second filter for providing thereto a version of signals conducted by said signal path so that signals conducted by said signal path are filtered in accordance with the transfer function of said second filter.

2. Apparatus comprising:
   a signal path comprising a transistor for amplifying signals conveyed by said signal path;
   a filter to be coupled to said transistor for controlling the current conduction of said transistor in accordance with the transfer function of said filter; and
   an amplifier coupled between said transistor and said filter for coupling currents conducted by said transistor to said filter, said amplifier having a substantially unity current gain and a voltage gain other than unity between said transistor and said filter, said voltage gain being related to the impedance presented by said filter to said amplifier such that when said filter impedance is changed by a proportional factor N and said amplifier voltage gain is changed by a proportional factor 1/N, the current conducted by said transistor is substantially unaffected.

3. Electrical signal processing apparatus comprising:
a signal path for conveying electrical signals;
an electrical signal filter network; and
means for coupling said filter network to said signal path to effect filtering of signals conveyed by said signal path, said coupling means comprising first and second terminals and a substantially load independent unity current gain signal translating circuit coupled to said signal path via said first terminal, and providing a translated version of said electrical signals to said filter network via said second terminal.

4. Apparatus according to claim 3, wherein
said coupling means exhibits at said second terminal a low impedance relative to the impedance of said filter network.

5. Apparatus according to claim 4, wherein
said translating circuit comprises an active current conducting device.

6. Apparatus according to claim 3, wherein
the impedance of said filter network is selected substantially in accordance with the ratio of the magnitude of translated signals as applied to said filter network, to the magnitude of electrical signals conveyed by said signal path.

7. Electrical signal processing apparatus comprising:
a signal path for conveying electrical signals;
an electrical signal filter network; and
means for coupling said filter network to said signal path to effect filtering of signals conveyed by said signal path, said coupling means comprising first and second terminals and a substantially load independent unity current gain signal translating circuit coupled to said signal path via said first terminal, and providing a translated version of said electrical signals to said filter network via said second terminal; wherein
the impedance of said filter network is selected substantially in accordance with the ratio of the magnitude of translated signals as applied to said filter network to the magnitude of electrical signals conveyed by said signal path;
said translating circuit applies an attenuated version of said electrical signals to said filter network; and
said filter network includes an inductor, the value of said inductor being selected substantially in accordance with the ratio of the magnitude of said attenuated signals to the magnitude of electrical signals conveyed by said signal path.

8. Electrical signal processing apparatus comprising:
a signal path for conveying electrical signals;
an electrical signal filter network; and
means for coupling said filter network to said signal path to effect filtering of signals conveyed by said signal path, said coupling means comprising first and second terminals and a substantially load independent unity current gain signal translating circuit coupled to said signal path via said first terminal, and providing a translated version of said electrical signals to said filter network via said second terminal; wherein said filter network comprises an electrical signal filter of the type comprising two signal ports and three terminals and having an associated transfer function; and
means coupled to said filter for synthesizing, at a single terminal, an impedance related to the transfer function of said filter, said translated signals being applied to said single terminal.

9. Apparatus according to claim 8, wherein
said translating circuit is coupled to a single point in said signal path.

10. Apparatus according to claim 8, wherein
said filter network and said translating circuit are coupled in shunt with said signal path via a single interface terminal.

11. Electrical signal processing apparatus comprising:
a signal path for conveying electrical signals;
an electrical signal filter network; and
means for coupling said filter network to said signal path to effect filtering of signals conveyed by said signal path, said coupling means comprising first and second terminals and a substantially load independent unity current gain signal translating circuit coupled to said signal path via said first terminal, and providing a translated version of said electrical signals to said filter network via said second terminal; wherein
said translating circuit comprises an active current conducting device having a main current conduction path coupled between said signal path and said filter network, and having a control terminal responsive to a translated verison of signals conveyed by said signal path.

12. Electrical signal processing apparatus comprising:
a signal path for conveying electrical signals;
an electrical signal filter network; and
means for coupling said filter network to said signal path to effect filtering of signals conveyed by said signal path, said coupling means comprising first and second terminals and a substantially load independent unity current gain signal translating circuit coupled to said signal path via said first terminal, and providing a translated version of said electrical signals to said filter network via said second terminal; wherein
said signal path comprises an amplifier with first and second electrodes defining a main current conduction path coupled to a load impedance; and
said translating circuit comprises an active current conducting device having first and second electrodes defining a main current conduction path for coupling said main current path of said amplifier to said filter network, and having a control terminal responsive to a translated version of signals conveyed by said signal path.

13. Apparatus according to claim 12, wherein
said load impedance, said main current path of said amplifier, said main current path of said translating circuit, and said filter network comprise a DC coupled current path between points of operating potential.

14. Apparatus according to claim 12, wherein
said amplifier comprises a transistor with a base input electrode for receiving signals, and collector and emitter electrodes defining the main current path of said transistor; and
said translating circuit comprises a coupling transistor with a base control electrode for receiving said translated signals, and collector and emitter electrodes defining the main current path of said coupling transistor, said collector and emitter electrodes of said coupling transistor being respectively coupled to said emitter of said amplifier transistor and to said filter.

15. Electrical signal processing apparatus comprising:

a signal path for conveying electrical signals;

an electrical signal filter network; and means for coupling said filter network to said signal path to effect filtering of signals conveyed by said signal path, said coupling means comprising first and second terminals and a substantially load independent unity current gain signal translating circuit coupled to said signal path via said first terminal, and providing a translated version of said electrical signals to said filter network via said second terminal; wherein said filter network comprises an electrical signal filter of the type comprising a first terminal corresponding to a signal port, a second terminal corresponding to a signal port, and a third terminal intermediate to said first and second terminals; said filter exhibiting a transfer function between said first and second terminals;

first means for coupling electrical signals from said signal path to said first filter terminal;

second means for coupling said second filter terminal to a reference potential; and third means for coupling electrical signals from said signal path to said intermediate third terminal;

wherein said signals coupled to said first and third filter terminals are derived from said second terminal of said coupling means comprising said translating circuit.

16. Apparatus according to claim 15, wherein said first and third coupling means respectively include separate signal voltage sources for separately exciting said first and third filter terminals.

17. Apparatus according to claim 16, wherein a resistance couples signal voltages to said first filter terminal; and signal voltages applied to said resistance and to said third filter terminal exhibit similar phase and substantially equal magnitude.

18. Apparatus according to claim 15, wherein said filter network is coupled to said translating circuit via a single terminal.

* * * * *